(12) United States Patent
Belitzer et al.

(10) Patent No.: US 7,145,388 B2
(45) Date of Patent: Dec. 5, 2006

(54) CONTROL LOOP HAVING AN AMPLIFIER ARRANGEMENT

(75) Inventors: Alexander Belitzer, München (DE); Martin Bosch, Lonsee (DE)

(73) Assignee: Infineon Technologies AG, Munich (DE)

(*) Notice: Subject to any disclaimer, the term of this patent is extended or adjusted under 35 U.S.C. 154(b) by 100 days.

(21) Appl. No.: 10/924,566

(22) Filed: Aug. 24, 2004

(65) Prior Publication Data

US 2005/0073363 A1 Apr. 7, 2005

(30) Foreign Application Priority Data

Aug. 25, 2003 (DE) ................ 103 39 055

(51) Int. Cl.
*H03F 3/45* (2006.01)
(52) U.S. Cl. ..................... 330/254; 330/278
(58) Field of Classification Search ............. 330/254, 330/278, 279
See application file for complete search history.

(56) References Cited

U.S. PATENT DOCUMENTS 6,710,657 B1 * 3/2004 Yang ................ 330/254
6,972,626 B1 * 12/2005 Takahashi et al. .......... 330/279

FOREIGN PATENT DOCUMENTS

DE 197 42 954 C1 2/1999

OTHER PUBLICATIONS

"Bipolar and MOS Analog Integrated Circuit Design", A. Grebene, ISBN 0-471-08529-4, p. 446, Figure 8.36.

* cited by examiner

*Primary Examiner*—Khanh Van Nguyen
(74) *Attorney, Agent, or Firm*—Eschweiler & Associates, LLC

(57) ABSTRACT

A control loop having an amplifier arrangement that has a variable gain is specified. The amplifier has an output for outputting a signal representing the present gain. The control loop comprises a combination unit, which combines the signal at the additional output with a threshold value in such a way as to avoid a kink in the characteristic curve in the region of the highest or lowest variable gain. The advantages of an amplifier that is voltage-linear within wide ranges can thus be united with low switching transients.

12 Claims, 5 Drawing Sheets

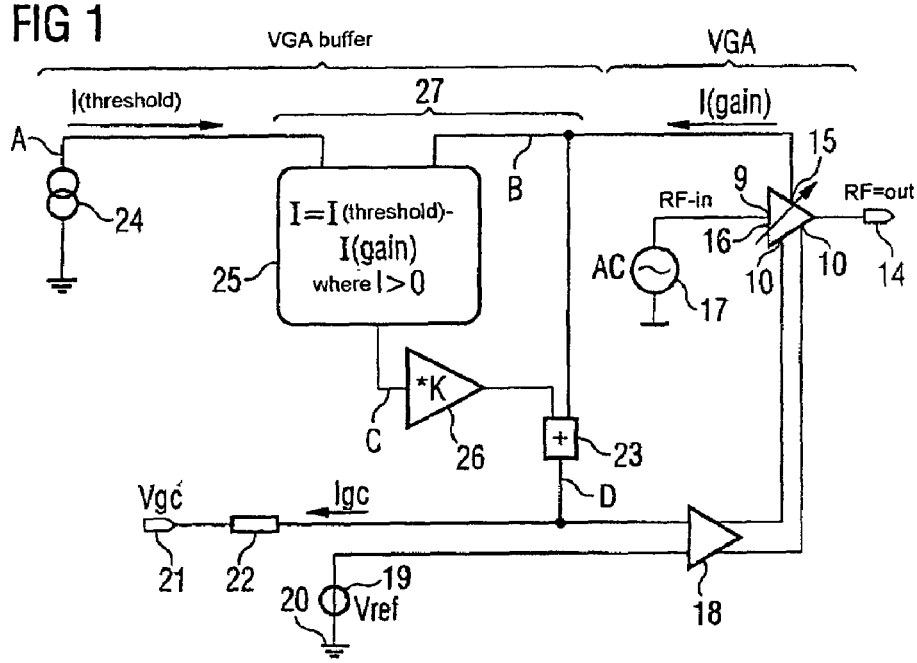
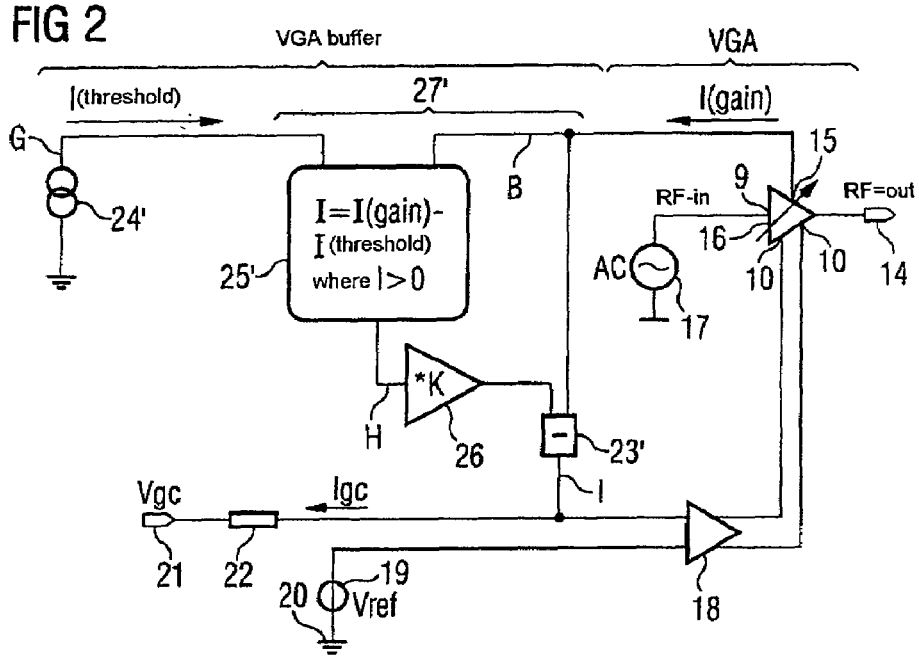

CONTROL LOOP HAVING AN AMPLIFIER ARRANGEMENT

REFERENCE TO RELATED APPLICATION

This application claims the benefit of the priority date of German application DE 103 39 055.3, filed on Aug. 25, 2003, the contents of which are herein incorporated by reference in their entirety.

FIELD OF THE INVENTION

The present invention relates to a control loop having an amplifier arrangement.

BACKGROUND OF THE INVENTION

In telecommunications, in particular radio frequency signal processing, the objective of generating a defined output level from a variable input level may frequently be encountered. Amplifiers having variable gain (which are also referred to as Variable Gain Amplifiers (VGA)) are normally used for this purpose.

VGAs of this type may have either a dB-linear or a voltage-linear characteristic curve, the latter being distinguished by the fact that they have a gain factor which is linear with respect to a reference variable, namely a control voltage.

The document by Alan Grebene: "Bipolar And MOS Analog Integrated Circuit Design", ISBN 0-471-08529-4 shows an example of a conventional VGA architecture in figure 8.36 on page 446. The so-called AGC (Automatic Gain Control) amplifier of broadband design shown there is based on the structure of a so-called Gilbert multiplier cell. In this case, provision is made of two differential amplifier cells which are connected in parallel on the control side, the desired gain being applied as reference variable to the differential input formed in this way. The base points of the two differential amplifier cells are connected to outputs of a further differential amplifier, which likewise has control inputs having a differential input for a signal to be amplified.

An amplified output signal—likewise present in differential form—can be discharged at the outputs of the two differential amplifier cells, said outputs being connected up to one another in a suitable manner. In other words, a radio frequency input signal which has been applied, at the base point, to the control inputs of the transistors of the differential amplifier is reversed in the quartet of four transistors of the differential amplifier cells. In this case, a variable signal current component from one transistor of each of the two differential amplifier cells is conducted to an electrical load, while the remaining partial currents of the respective other differential amplifier cell transistors are conducted directly to the supply potential and are thus discarded. A structure of this type having a reference variable is usually driven using a so-called VGA buffer, to be precise in such a manner that the transistors of the differential amplifier cells are simulated there and are connected up as diodes in order to generate voltages via variable currents on their diode characteristic curves, said voltages in turn serving as a reference variable, namely as a control voltage for the gain of the amplifier having variable gain. The currents to be set are in turn controlled using a guide voltage UGC (gain control voltage). A buffer structure of this type itself has a hyperbolic transfer function caused by the current-voltage conversion on the diode characteristic curves of the simulated transistors. If a linear behavior of the gain factor is desired, this is possible approximately only in a narrow central operating range.

In order to nevertheless achieve a wide dynamic range, a VGA could be embodied in a plurality of stages. However, this would be associated with the disadvantage of a large area occupation when embodied using integrated circuit technology in conjunction with a likewise disadvantageous high current consumption. However, the disadvantage of the single-stage embodiment explained is that, in the case of a high dynamic response requirement, the four transistors of the two differential amplifier cells of the Gilbert multiplier have to be reversed within a very wide range. This means that the diodes modeled on these transistors in the VGA buffer also have to be reversed within a wide range. If high attenuation of the radio frequency input signal is desired in this case, the output transistors and thus also one of the diodes assigned to the latter in the buffer must become virtually de-energized. However, in this virtually de-energized operating state, manufacturing fluctuations during the production of integrated circuits and also temperature fluctuations lead to particularly great changes in the gain factor selected. When the gain is considered logarithmically, this disadvantageous behavior has such an effect that it is practically no longer possible to correctly set a low gain. If the gain factor tends toward zero, the gain tends practically toward minus infinity. Yet another disadvantage of the known structure described is that the diodes in the VGA buffer have to have the same current density as the quartet of transistors of the differential amplifier cells. If the VGA is to enable high output powers, the largest current component of the VGA buffer is in the two transistor diodes mentioned.

It may be desirable to design a control loop having an amplifier such that the gain factor of the amplifier is proportional to a reference variable. In the case of such a control loop, the minimum and the maximum gain is determined by the amplifier with a variable gain factor. In this case, the problem can arise that such a linear gain factor extends as far as the minimum gain factor that can be set, and, if the gain is considered with a logarithmic gain factor, may lead to a very high amplifier slope. If the gain factor tends towards zero, then the gain tends towards minus infinity. Slopes of hundreds of dB per volt may occur in this case. The undesirable consequence would be a severe feedthrough of disturbances such as noise at the control input of the amplifier onto the gain factor set. This would be associated with the disadvantage that when setting very small gain factors, that is to say high attenuations, large fluctuations in the gain would occur in the event of disturbances at the reference variable input of the controller.

A similar problem area could result at the maximum of the variable gain of the gain factor characteristic curve. If an amplifier circuit having a voltage-linear amplifier characteristic curve is required, then a kink in the characteristic curve results in the region of the maximum of the gain, said kink being undesirable. If an amplifier having such a characteristic curve is used for example in a mobile radio transmitter for the purpose of setting the transmission power, so-called switching transients inevitably arise on account of the property of the amplifier characteristic curve described. Said switching transients are undesirable spectral energy components which are generated during variation of the gain along the characteristic curve.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a control loop having an amplifier arrangement which has a voltage-linear characteristic curve and nevertheless has improved properties with regard to interference signals in the edge regions of the amplifier characteristic curve, that is to say in the region of the minimum and/or maximum gain that can be set.

According to one or more aspects of the invention, a control loop is provided having an amplifier arrangement, the amplifier arrangement comprising a radio frequency signal input, an output for tapping off an amplified signal, an input for setting the gain, and an additional output for providing a signal representing the gain of the amplifier arrangement. The control loop further comprises a combination unit having a first input, which is connected to the additional output, a second input for feeding a threshold value, and an output. The control loop further comprises a control amplifier, which couples the output of the combination unit to the input for setting the gain, and which controls the gain of the amplifier arrangement.

In accordance with a further aspect of the invention, a threshold is introduced which is combined with the output signal of the amplifier representing the gain thereof. The combination is effected such that a characteristic curve kink in the amplifier characteristic curve at the minimum and/or maximum of the variable gain of the amplifier has a softer transition, wherein the slope of the amplifier characteristic curve is reduced in the region of the minimum and/or maximum of the variable gain.

The combination of the threshold value with the signal representing the gain of the amplifier arrangement in the control loop may advantageously be effected, for example, in such a way that the combination unit comprises a subtraction element (subtractor) and an addition element (adder) that the additional output is connected to a respective input of the addition element and of the subtraction element, that a further input of the subtraction element is designed for feeding the threshold value, that the output of the subtraction element is coupled to a further input of the addition element, and that the output of the addition element is coupled to an input of the control amplifier.

In this case, a difference between the signal representing the gain of the amplifier arrangement and the threshold value is advantageously formed in the subtraction element. This difference is fed, if appropriate in weighted fashion, to an input of the adder, where it is combined with the signal representing the gain of the amplifier arrangement.

In order to reduce the slope of the amplifier characteristic curve in the region of minimum gain and thus to avoid a characteristic curve kink there, the subtractor is advantageously embodied such that the value representing the gain of the amplifier is subtracted from the threshold value.

Preferably, in order to reduce the slope of the amplifier characteristic curve at the maximum thereof and thus to avoid a kink at the maximum of the amplifier characteristic curve, the subtractor is embodied such that the threshold value is subtracted from the signal representing the gain of the amplifier. In addition, the adder is in this case designed with an inverting input in such a way that the signal formed in the subtraction element is subtracted, if appropriate in weighted fashion, from the signal representing the gain of the amplifier arrangement.

In both cases described, the weighting of the signal at the output of the subtraction element may preferably be achieved by means of an amplifier having a predetermined gain factor. In accordance with the invention, moreover, a preferred embodiment of the combination unit with subtractor and addition element may be embodied doubly, wherein a first combination unit is provided with an adder and a subtractor, and a second combination unit is also provided with corresponding addition and substraction elements. In this example, one combination unit can be designed such that a kink at the maximum of the gain of the amplifier characteristic curve is avoided, and the kink at the minimum of the characteristic curve of the gain factor is avoided by the second combination unit.

In accordance with one or more further aspects of the invention, the amplifier arrangement in the control loop that has a variable gain. In accordance with these aspects of the invention, the amplifier arrangement may comprise a Gilbert multiplier circuit and an additional transistor. In this example, the Gilbert multiplier circuit comprises two inputs, with one input serving to set the gain and another input serving as a radio frequency signal input, as well as having the output. The additional transistor comprises a control terminal and a load terminal, where the load terminal is connected to the control terminal and to the load terminal of a transistor of the multiplier circuit. The additional transistor also comprises a further load terminal, which forms the additional output of the amplifier arrangement, for providing the signal representing the gain of the amplifier arrangement.

In this arrangement, a small portion of the signal current is branched off by means of the additional transistor, where the branched portion is proportional to the presently set gain factor. It is thus possible to set the gain factor of the amplifier arrangement such that, in the case of a high dynamic response, a stable gain factor in conjunction with a simultaneously voltage-linear characteristic curve within wide ranges of the amplifier is ensured. Since the additional transistor always emits, at its additional output, a signal representing the present gain factor of the entire amplifier arrangement, it is also advantageously possible to compensate for temperature drift effects as well as manufacturing variations and their effects on the gain factor without any problems.

In one exemplary implementation, the Gilbert multiplier circuit may comprise two differential amplifier cells, the base points of which are driven by a further differential amplifier. In this example, the base points of the two differential amplifier cells are preferably understood as meaning their respective common emitter or source terminals. The control terminal and one of the load terminals of the additional transistor are preferably connected to the control terminal and one of the load terminals of a transistor of one of the two differential amplifier cells of the Gilbert multiplier circuit.

In one implementation, the Gilbert multiplier circuit comprises a first differential amplifier and a second differential amplifier, each having two transistors, the control terminals of which are connected to the input for setting the gain. The Gilbert multiplier circuit may further comprise a third differential amplifier having two respective transistors, the control terminals of which form a radio frequency signal input of the amplifier arrangement, as well as an additional transistor or a further additional transistor being assigned to each of the transistors of the first and second differential amplifiers.

In one possible implementation, a total of four additional transistors may be provided in order to ensure greater symmetry of the entire circuit. In this case, the respective further load terminals of the further additional transistors are preferably connected to the supply potential terminal of the amplifier. The additional output of the amplifier arrangement is thus formed in this case only at one of the additional transistors, it being possible to tap off, at said additional output, a signal representing the gain of the amplifier arrangement. The additional transistor and the further additional transistors preferably have smaller dimensions than the transistors of the first and the second differential amplifier, and are accordingly of smaller size. This means that the additional transistor and the further additional transistors branch off only a very small portion of the signal current, with the result that the perturbation effects of the additional transistors on the amplifier arrangement remain minor overall.

In one possible implementation, the four transistors of the first and the second differential amplifier are preferably connected up to the supply potential in such a manner that the load terminal of one transistor of each differential amplifier is directly connected to the supply potential and one load terminal of each further transistor in the first and second differential amplifiers is connected to the supply potential via an electrical load. The two last-mentioned transistors form the signal output of the amplifier arrangement at the connecting nodes to the electrical load. The additional transistor at which the additional output of the amplifier arrangement is formed is preferably assigned to one of those transistors of the differential amplifiers of the Gilbert multiplier to which the electrical load is connected and at which the signal output is formed. The electrical load is preferably in the form of an impedance but a purely resistive load may also be provided. The amplifier arrangement is preferably constructed using bipolar circuit technology, which affords, inter alia, the advantage of good suitability for particularly high signal frequencies.

Overall, the principle proposed consequently makes it possible to combine a linear relationship of the gain of an amplifier having a variable gain with respect to a control voltage in the region of low and high gain such that the slope remains small in the region where particularly high and particularly low gain and the linear relationship of the characteristic curve of the amplifier is nevertheless retained in a wide range. In this case a signal proportional to the gain factor is modified by means of the combination unit such that a hyperbolic profile is adapted, if appropriate in a plurality of steps, in the region of minimum or maximum gain. If, in the preferred manner, the threshold value is generated as a temperature-stable and manufacturing-stable value, particularly small variations in the gain factor occur in the minimum and/or maximum gain region with respect to temperature drifts and manufacturing variations.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

The invention is explained in more detail below on the basis of exemplary embodiments with reference to a plurality of drawings, wherein:

FIG. 1 shows a circuit diagram of an exemplary implementation of a control loop in accordance with the present invention, in which the characteristic curve has a reduced slope in the region of low gain;

FIG. 2 shows a circuit diagram of a further exemplary implementation of a control loop in accordance with the invention, in which the amplifier characteristic curve has a smaller slope in the region of maximum gain that can be set;

DETAILED DESCRIPTION OF THE INVENTION

Figure 3:
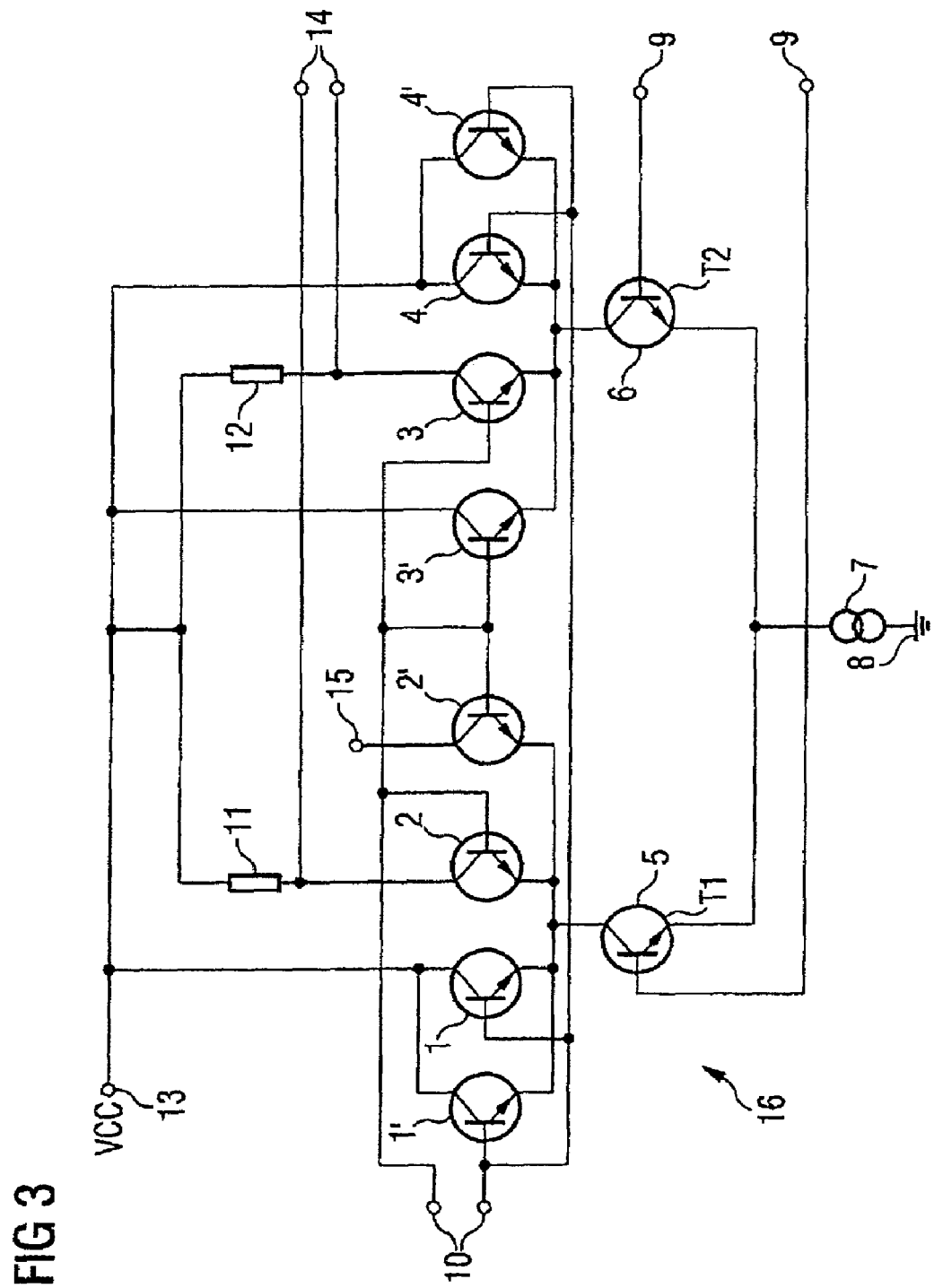
FIG. 3 shows a circuit diagram illustrating an exemplary implementation of an amplifier arrangement as can be used in the controllers in accordance with FIG. 1 or 2.

The present invention will now be described with reference to the attached drawing figures, wherein like reference numerals are used to refer to like elements throughout. One or more implementations of the present invention will now be described with reference to the attached drawings, wherein like reference numerals are used to refer to like elements throughout.

FIG. 1 shows a first exemplary embodiment of a control loop having an amplifier arrangement 16 in accordance with the principle proposed. The amplifier arrangement 16 has a radio frequency signal input 9, an output 14 for tapping off an amplified signal derived from the signal present at the input 9, and also an input 10 for setting the gain and an additional output 15 for providing a signal (I(gain) in FIG. 1) representing the gain of the amplifier arrangement 16. A signal source 17 is connected to the radio frequency input 9 of the amplifier 16. The control input 10 of the amplifier 16 is connected to the output of a conventional operational amplifier 18, which operates as a control amplifier in the present case. The additional output 15 of the amplifier 16 is connected to an inverting input of the operational amplifier 18 in a negative feedback via an addition element or adder 23. A noninverting input of the operational amplifier 18 is connected to a reference potential terminal 20 via a reference voltage source 19. A reference variable for the control loop can be fed to a reference variable input 21 in the form of a desired voltage signal $V_{GC}$ (guide voltage) for the gain. Said reference variable input 21 is connected to the inverting input of the operational amplifier 18 via a resistor 22, at which the guide voltage $V_{GC}$ is converted into a proportional current $I_{GC}$.

The addition element or adder 23 is part of a combination unit 27, which also comprises a subtraction element or subtractor 25 and an amplifier 26. The subtraction element 25 has a first input, at which a threshold value is present in the form of a current ($I_{(threshold)}$ in FIG. 1) provided by a current source 24. A second or further input of the subtraction element 25 is connected to the additional output 15 of the amplifier 16. The subtractor 25 provides an output C that is the difference between the threshold value current $I_{(thresh-}$ $_{old}$) and the current I(gain) that can be tapped off at the additional output, wherein the difference current C at the output of the subtraction element 25 is greater than zero. The difference current C at the output of the subtraction element 25 is weighted with a gain factor K in an amplifier 26 connected downstream of the subtractor 25. The output of the amplifier 26 is connected to an input of the addition element 23, the addition element 23 having a further input that is likewise connected to the additional output 15 of the amplifier 16.

A threshold current is provided by means of the current generator 24 operating in a manner free of the temperature drift and in a manner free of manufacturing fluctuations. The current B at the additional output 15, which is proportional to the gain factor of the amplifier 16 currently set, is subtracted from the threshold current A in the subtractor 25. Due to the circuitry, the current C at the output of the subtractor 25 is never less than zero. The difference current C at the output of the subtractor 25 is provided with a weighting, for example, a gain factor K of 0.5 in the illustrated implementation, by virtue of the amplifier 26. The result at the output of the amplifier 26 is added in the added 23 to the current at the additional output 15, where the output D of the adder 23 is combined with the current $I_{GC}$ representing the reference variable of the controller.

As explained in more detail further below on the basis of graphs, the control loop of FIG. 1 makes it possible to provide a voltage-linear characteristic curve of the amplifier 16 in the region of low gain with a hyperbolic profile. In this case, the slope of the characteristic curve is reduced in the region of low gain. The linear relationship between reference variable and gain factor is nevertheless retained in wide ranges of the gain. This affords the advantage that disturbances at the control terminal 21 of the control loop have only minor effects on the gain. Additional advantages reside in the small temperature drift of the circuit, as well as a small overall temperature dependence of the control loop, a small variation of the gain over manufacturing fluctuations, and a small variation of the gain over fluctuations in the supply voltage. In another possible implementation, instead of the single-stage reduction of the slope of the gain that is shown in FIG. 1, the invention may be implemented in a plurality of steps in the region of the minimum gain, thus resulting in an even better approximation to a hyperbolic profile of the characteristic curve in the region of particularly low gain factors.

FIG. 2 shows an alternative embodiment of a control loop having an amplifier circuit in accordance with the present invention. In terms of the components used, their function and their advantageous interaction, the circuit of FIG. 2 largely corresponds to that of FIG. 1 and, in this respect, is not described again at this juncture. Differences reside merely in the embodiment of the subtraction element and the addition element, which are provided with reference symbols 25', 23', respectively, in FIG. 2. In the embodiment of FIG. 2, the subtraction element 25' is designed such that its output H emits a current resulting from the current B at the additional output 15 reduced by the current G provided by the current generator 24, wherein the current H at the output of the subtraction element 25' is never less than zero. The addition element 23' of FIG. 2 has an inverting input, wherein the signal H at the output of the amplifier 26 is fed to the addition element 23' with a negative sign (inverting input).

In the circuit of FIG. 2, in the region of the highest variable gain of the amplifier 16, the characteristic curve is modified in such a way as to avoid a characteristic curve kink in the gain. In this case, the slope of the characteristic curve is reduced in the region of the highest variable gain. In accordance with the invention, the maximum of the gain factor is reached asymptotically, thereby avoiding a kink in the profile of the curve. Since the current source 24' supplies a stable quantity in the form of a threshold current, only very small variations in the gain factor occur with respect to manufacturing fluctuations and temperature fluctuations. In particular, the advantage afforded is that switching transients are reduced.

In another aspect of the invention, the circuits of FIGS. 1 and 2 may be combined with one another such that the amplifier characteristic curve in the region of minimum gain and in the region of maximum gain has a smaller slope with the advantages described above.

FIG. 3 shows an exemplary implementation of the amplifier arrangement 16 which may be employed in FIGS. 1 and 2. The circuit of FIG. 3 is based on a Gilbert multiplier circuit. A first transistor 1 and a second transistor 2 are connected to one another on the emitter side and form a first differential amplifier. A second differential amplifier is formed by transistors 3 and 4, which are likewise connected on the emitter sides thereof. The two emitter nodes are connected to respective collector terminals of further transistors 5 and 6, which form a third differential amplifier. In this case, the emitter terminals of the transistors 5 and 6 of the third differential amplifier are connected to one another and are connected to the reference potential 8 via a current source 7. The base terminals of the transistors 5 and 6 of the third differential amplifier form the symmetrical radio frequency signal input 9 of the amplifier arrangement. A likewise symmetrical input 10 for setting the gain factor of the amplifier arrangement is formed at the base terminals of the transistors 1, 2, and 3, 4 of the first and second differential amplifiers, respectively. To this end, the base terminals of the transistors 1 and 4 and also the base terminals of the transistors 2 and 3 are connected to one another, respectively. Whereas the collector outputs of the transistors 2 and 3 are connected to the supply potential 13 via an electrical load 11, 12 and at the same time form the symmetrical signal output 14 of the amplifier arrangement, the collector terminals of the transistors 1 and 4 are directly connected to the supply potential 13. A Gilbert multiplier circuit designed as an amplifier is thus formed.

An additional transistor 2', which is connected to the transistor 2 at the base and emitter terminals, is assigned to the transistor 2 in the first differential amplifier 1, 2. The collector terminal of the additional transistor 2' forms an additional output 15, at which a current I(gain) which is proportional to the present gain of the amplifier arrangement may be tapped off, as in the examples of FIGS. 1 and 2 above. For reasons of symmetry, further additional transistors 1', 3', and 4' are individually assigned to each of the other differential amplifier transistors of the first and second differential amplifiers 1, 2, 3, 4, where the further additional transistors are likewise connected to the respective assigned transistor at the emitter and base terminals. The collector terminals of the further additional transistors 1', 3', 4' are connected to the supply potential terminal 13 (VCC in FIG. 3). In the illustrated implementation, the additional transistor 2' and the further additional transistors 1', 3', 4' are dimensioned to be considerably smaller than the transistors 1, 2, 3, 4 of the first and second differential amplifiers.

The radio frequency input signal applied to the transistors 5 and 6 via the input 9 is reversed in the quartet of transistors 1 to 4. Reversal is effected in a manner dependent on the desired gain factor present as a reference variable at the input 10. In this case, a variable signal current component from the transistors 2 and 3 is conducted to the resistive load (used as an example here and designated by reference symbols 11, 12) and the remaining partial current from the transistors 1 and 4 is conducted directly to VCC and is thus discarded. In addition, the additional transistor 2' and also, for reasons of symmetry, further additional transistors 1', 3', 4' are introduced. The current I(gain) at the additional output 15 is proportional to the gain factor, where the transistors 1', 3', 4' are present only for reasons of symmetry, and the currents thereof are conducted directly to VCC. On account of their smaller dimensioning in the illustrated implementation, the additional transistors and further additional transistors 1', 2', 3', 4' branch off only a small portion of the signal current.

A current I(gain) which is proportional to the gain factor is available at the additional output 15, with the result that manufacturing and temperature fluctuations in the gain factor can be detected and, if appropriate, calibrated away without any problems. This makes it possible to achieve a gain factor which can be set in a stable manner and, in addition, makes possible a voltage-linear amplifier characteristic curve. On account of the single-stage embodiment of the VGA shown, operation of the amplifier with a low current consumption is ensured. In addition, a low area requirement results since only a single-stage amplifier is required and the additional transistors have small dimensions.

Instead of the embodiment using bipolar technology shown, the circuit may alternatively be implemented using other transistor types, such as metal oxide semiconductor (MOS) circuit technology.

Figure 4:
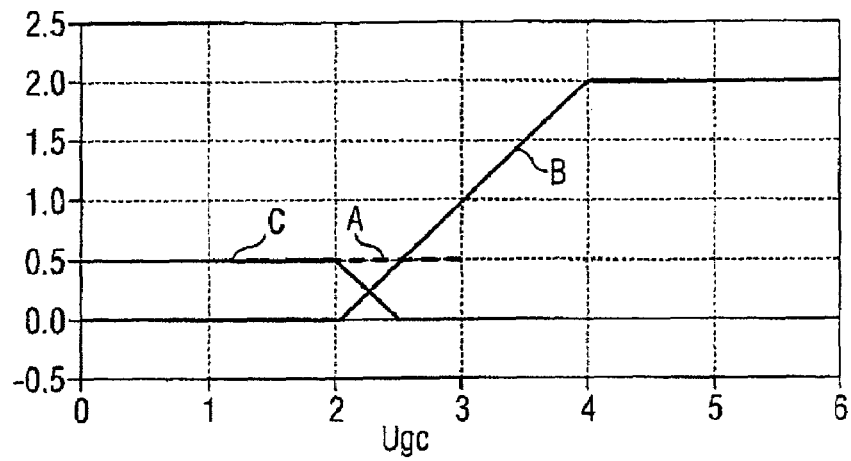
FIGS. 4–7 show the reduction of the slope in the region of minimum gain of the characteristic curve in accordance with the circuit of FIG. 1 on the basis of graphs.

FIGS. 4–7 show the function of the exemplary circuit of FIG. 1, in particular of the combination unit 27, on the basis of graphs. In the graph of FIG. 4, the constant threshold current of the current source 24 is designated by A, the current proportional to the gain factor at the additional output 15 is designated by B, and the current signal at the output of the subtractor 25 is provided with reference symbol C. The characteristic curves A, B, C are plotted against the reference variable $V_{GC}$ (Ugc in the figures) of the controller. It is evident that, coming from large voltages $V_{GC}$, the difference current C is zero (for decreasing Ugc values) up to that reference variable at which the characteristic curves B and A intersect. From that point, the current C rises linearly until it reaches a maximum in order then to remain constant.

Figure 5:
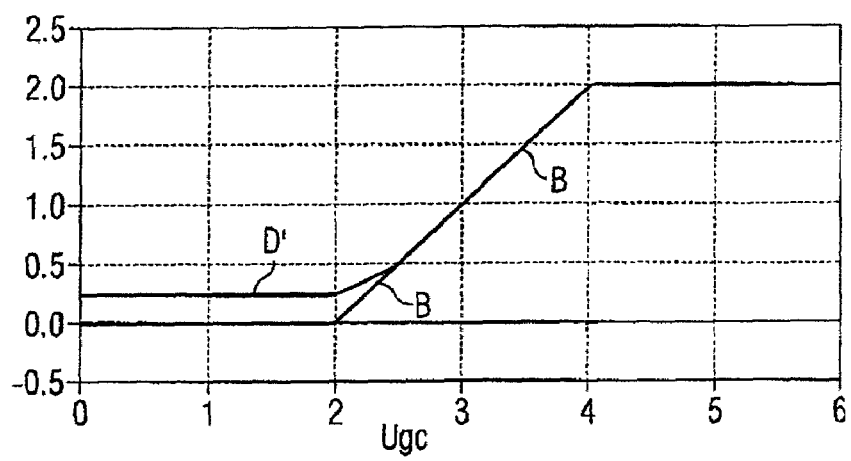
Figure 6:
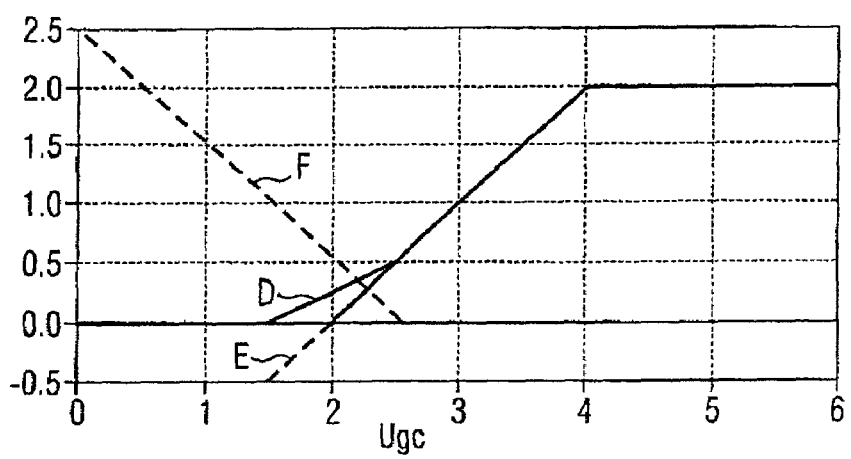

FIG. 5 shows the first step for constructing the current D at the output of the addition element 23. The current C at the subtractor output halved by the amplifier 26 is added to the current B at the additional output 15 to form the signal D'. It is evident that from the point at which the difference current C is greater than zero, the characteristic curve D' has a smaller slope. A residual current would remain at the point at which the difference current C becomes constant. What is beneficial in this case, however, is that the VGA buffer of FIG. 1 has a larger control range than the amplifier arrangement 16 itself. The current limiting occurs if the current of the amplifier 16 is completely reversed, that is to say is zero at the lower point. We assume for the construction that if the current could become negative, then the conditions as shown in FIG. 6 result. A fictitious current E is additionally plotted therein, whereby given the same current A the fictitious current F results from the difference between the fictitious current E and the threshold A. If the sum is then again formed in the addition element 23, it is evident that the current D at the output of the adder 23 falls to zero with a reduced gradient and cannot really become negative.

The current D reaches its minimum proceeding from large reference variables later than the current B at the additional output. What is thus achieved is an extension on the axis of the reference variable, a first approximation to a hyperbolic profile of the characteristic curve in this region. It should be noted that only the threshold current A is used as the external signal.

Figure 7:
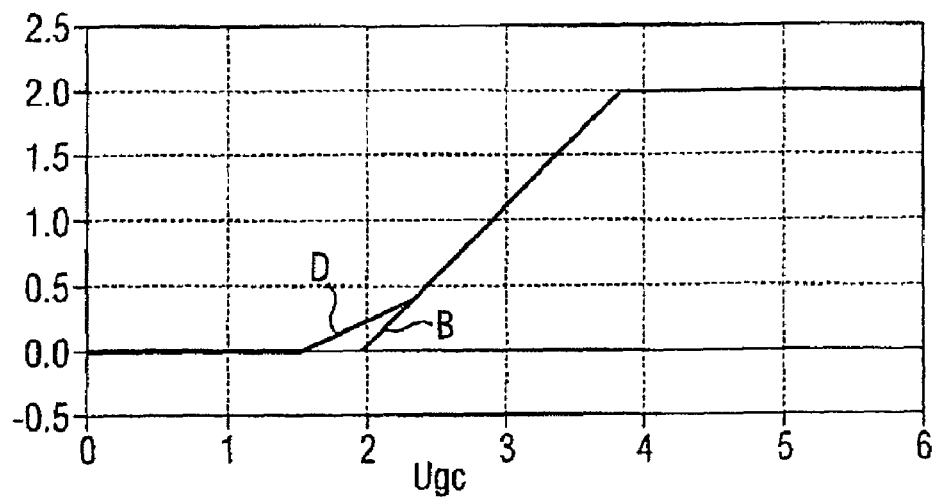

FIG. 7 shows the comparison of the current B at the additional output, which has a kink in the region of very low gain, and the current D at the output of the addition element 23. Other implementations are possible within the scope of the invention that may provide a plurality of combination units 27 having different threshold currents and/or different weighting factors K in the amplifier 26, in order thus to better approximate the profile of the gain characteristic curve in the region of low gains to a hyperbolic profile.

Figure 8:
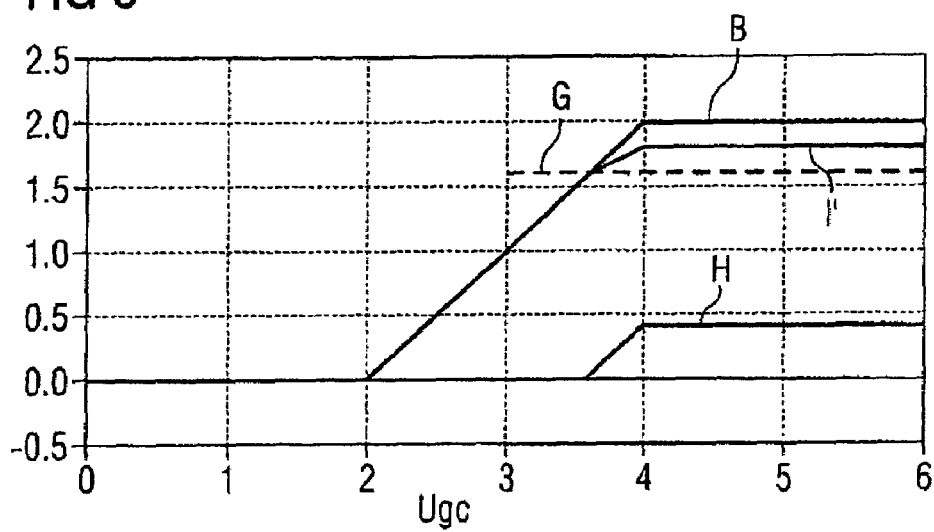
FIGS. 8–10 show graphs illustrating the reduction of the slope of the characteristic curve of the amplifier in the region of maximum gain that can be set in accordance with the circuit of FIG. 2.
Figure 9:
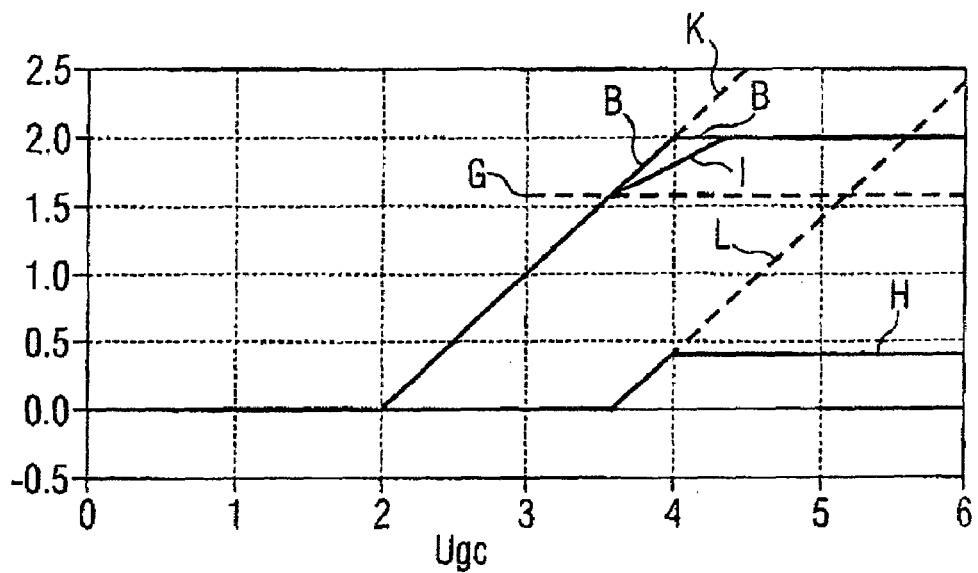

By analogy with FIGS. 5–7, FIGS. 8–10 show the signal conditions in the circuit in accordance with FIG. 2. The generator 24' of FIG. 2 provides a constant current threshold G of FIGS. 8 and 9. By means of this threshold, a difference current H resulting from the difference between the current B at the additional output 15 and the threshold G is generated in the subtraction element 25'. The difference current H is weighted, in the present case halved by means of the amplifier 26 (gain factor K or 0.5), and is then subtracted from the current B in the addition element 23'. The resulting current I' is depicted in FIG. 8 (indicated as current I at the output of the adder 23' in FIG. 2). It is evident in FIG. 8 that from the point at which the difference current H is greater than zero, the resulting current I' has a smaller gradient. From the point at which the difference current I' is constant, the full reversal of the amplifier 16 would be reached. What is beneficial in this case, too, however, is that the VGA buffer of FIG. 2 has a larger control range than the amplifier arrangement 16 itself. The limiting commences if the current of the amplifier 16 is completely reversed. It shall be assumed for the construction that the current could exceed the maximum. The conditions as shown in FIG. 9 would then result.

A fictitious current K is additionally depicted in FIG. 9, whereby the resulting fictitious difference current L is produced given the same threshold G. If the combination with the current at the additional output is then once again formed, the desired characteristic curve I results and it is evident that the profile of the current I rises with a reduced slope up to the maximum.

Figure 10:
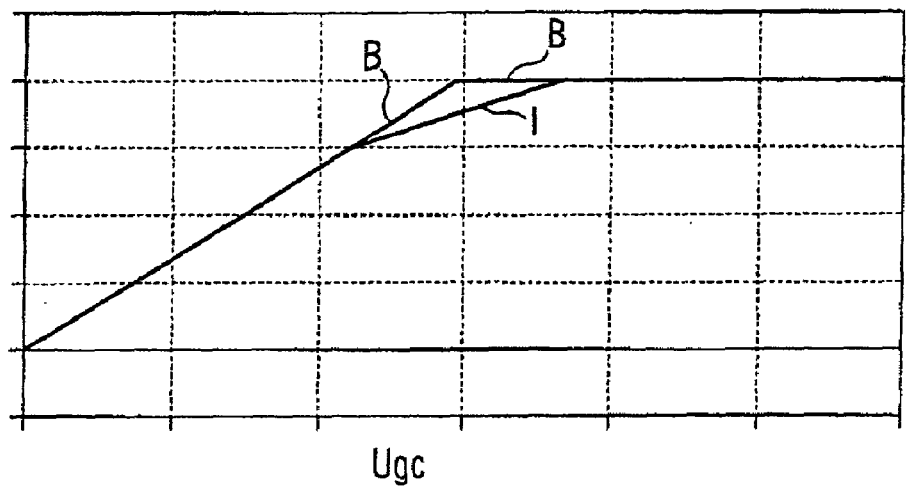

Referring also to FIG. 10, it is clear that the current I at the output of the adder 23' reaches its maximum later than the current B at the additional output 15. What is thus achieved is an extension relative to the $U_{GC}$ axis, a first approximation to a hyperbolic profile of the characteristic curve in the region of maximum gain that can be set. This requires only one, stable reference variable G.

A plurality of stages of the combination unit 27' may be provided in this case, too, so that the profile can be approximated to a hyperbolic characteristic curve profile in a manner that is as precise as desired. The better the characteristic curve is matched to a hyperbolic profile, the fewer switching transients are generated during the ramping of the amplifier 16.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A control loop, comprising:
   an amplifier arrangement having a radio frequency signal input, an output for tapping off an amplified signal, having an input for setting a gain and having an additional output for providing a signal representing gain of the amplifier arrangement;
   a combination unit having a first input which is connected to the additional output, a second input for feeding a threshold value, and an output; and
   a control amplifier which couples the output of the combination unit to the input for setting the gain and which controls the gain of the amplifier arrangement.

2. The control loop as claimed in claim 1, wherein the combination unit comprises a subtraction element, and an addition element;
   wherein the additional output is connected to a respective input of the addition element and of the subtraction element;
   wherein a further input of the subtraction element is adapted for feeding the threshold value;
   wherein the output of the subtraction element is coupled to a further input of the addition element; and
   wherein the output of the addition element is coupled to an input of the control amplifier.

3. The control loop as claimed in claim 2, wherein the subtraction element is adapted for subtracting the signal representing the gain of the amplifier arrangement from the threshold value.

4. The control loop as claimed in claim 2, wherein the subtraction element is adapted for subtracting the threshold value from the signal representing the gain of the amplifier arrangement, and the addition element is coupled to the output of the subtraction element via an inverting input.

5. The control loop as claimed in claim 2, wherein an amplifier having a predetermined gain is provided for a purpose of coupling the output of the subtraction element to the addition element.

6. The control loop as claimed in claim 1, wherein the amplifier arrangement comprises:
   a Gilbert multiplier circuit having two inputs, one input of which serves to set gain and another input of which serves as a radio frequency signal input, and having the output; and
   an additional transistor having a control terminal and a load terminal, the load terminal being connected to the control terminal and the load terminal of a transistor of the multiplier circuit, the additional transistor having a further load terminal which forms the additional output of the amplifier arrangement for providing the signal representing the gain of the amplifier arrangement.

7. The control loop as claimed in claim 6, wherein the Gilbert multiplier circuit comprises a first differential amplifier and a second differential amplifier, each differential amplifier having two transistors, the control terminals of which are connected to the input for setting gain;
   wherein the Gilbert multiplier circuit comprises a third differential amplifier having two respective transistors, the control terminals of which form the radio frequency signal input of the amplifier arrangement; and
   wherein a further additional transistor is assigned to each of the transistors of the first and second differential amplifiers.

8. The control loop as claimed in claim 7, wherein the additional transistor and the further additional transistors have smaller dimensions than the transistors of the first and the second differential amplifier.

9. The control loop as claimed in claim 7, wherein one load terminal of each of the further additional transistors is connected to a supply potential terminal.

10. The control loop as claimed in claim 7, wherein one load terminal of each of the transistors of the first and second differential amplifiers is coupled to a supply potential terminal via a symmetrical electrical load, at which the output of the amplifier arrangement is formed.

11. The control loop as claimed in claim 10, wherein the electrical load is an impedance.

12. The control loop as claimed in claim 6, wherein the amplifier arrangement is constructed using bipolar circuit technology.

* * * * *